US010242938B2

United States Patent
Cho et al.

(10) Patent No.: US 10,242,938 B2
(45) Date of Patent: Mar. 26, 2019

(54) INTEGRATED SHUNT IN CIRCUIT PACKAGE

(71) Applicant: Infineon Technologies America Corp., El Segundo, CA (US)

(72) Inventors: Eung San Cho, Torrance, CA (US); Wolfgang Furtner, Fuerstenfeldbruck (DE)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/596,550

(22) Filed: May 16, 2017

(65) Prior Publication Data

US 2018/0337115 A1    Nov. 22, 2018

(51) Int. Cl.
| | | |
|---|---|---|
| *H01L 23/495* | (2006.01) | |
| *H01L 23/48* | (2006.01) | |
| *H01L 21/60* | (2006.01) | |
| *H01L 21/66* | (2006.01) | |
| *H01L 25/18* | (2006.01) | |
| *H01L 49/02* | (2006.01) | |

(52) U.S. Cl.
CPC .. *H01L 23/49575* (2013.01); *H01L 23/49541* (2013.01); *H01L 25/18* (2013.01); *H01L 28/20* (2013.01)

(58) Field of Classification Search
CPC .............. H01L 23/49575; H01L 28/20; H01L 23/49541; H01L 23/48541; H01L 25/18; H01L 2224/48091
See application file for complete search history.

(56) References Cited

U.S. PATENT DOCUMENTS

| | | | |
|---|---|---|---|
| 5,534,788 A | 7/1996 | Smith et al. | |
| 6,225,684 B1 | 5/2001 | Stitt, II et al. | |
| 6,313,598 B1 * | 11/2001 | Tamba ................ | H01L 23/3107 257/692 |
| 6,927,481 B2 | 8/2005 | Gibson et al. | |
| 7,847,391 B2 | 12/2010 | Udompanyavit et al. | |

(Continued)

OTHER PUBLICATIONS

Shalmany, et al., "A ±5 A Integrated Current-Sensing System With ±0.3% Gain Error and 16 µA Offset From −55° C. to +85° C.," IEEE Journal of Solid-State Circuits, vol. 51, No. 4, Apr. 2016, pp. 800-808.

(Continued)

*Primary Examiner* — Jasmine Clark
(74) *Attorney, Agent, or Firm* — Shumaker & Sieffert, P.A.

(57) ABSTRACT

The disclosure is directed to a circuit on a substrate, such as a leadframe package, that includes shunt to measure current. The shunt is an arched conductor positioned to bridge over a die mounted on the package with voltage measurement terminals of the die electrically connected to the shunt. The techniques of this disclosure determine the shunt material, shunt size and shape to accurately control the value of the resistance of the shunt. The arrangement of the die and the shunt may include advantages of maintaining a small package size and allow accurate temperature compensation. The shunt may be long enough to have a measurable resistance that may be used to determine the current through the shunt. In some examples, the arrangement of the die and the shunt may provide additional structural support to the circuit.

20 Claims, 5 Drawing Sheets

(56) References Cited

U.S. PATENT DOCUMENTS

| | | |
|---|---|---|
| 8,446,159 B2 | 5/2013 | Porter et al. |
| 2009/0102493 A1 | 4/2009 | Disney et al. |

OTHER PUBLICATIONS

"The CircuitCalculator.com Blog," Circuitcalculator.com, Jan. 24, 2016, 2 pp.

"INA250 36-V, Low- or High-Side, Bidirectional, Zero-Drift Current-Shunt Monitor with Precision Integrated Shunt Resistor," Texas Instruments, Data Sheet INA250A1, INA250A2, INA250A3, INA250A4, Apr. 2015, 33 pp.

* cited by examiner

US 10,242,938 B2

INTEGRATED SHUNT IN CIRCUIT PACKAGE

TECHNICAL FIELD

The disclosure relates to electronic circuit packages.

BACKGROUND

Measuring current in a circuit may be accomplished, in some examples, by including a small resistance in series with the current path and measuring the voltage across the resistance. Circuits assembled on a package, such as quad flat no-lead (QFN) packages, dual flat no-lead (DFN) packages, lead frame chip scale packages (LFCSP) and similar packages may include a shunt that takes advantage of the resistance present in any conductor. Some examples of these circuits may measure the voltage across a portion of the conductor carrying the current to take advantage of the resistance in the conductor, rather than adding a separate resistor. The value of a resistor, including the resistance inherent in any conductor, may change with temperature.

SUMMARY

In general, the disclosure is directed to a circuit on a substrate that includes a shunt to measure current, where the shunt is an arched conductor positioned to bridge over a die mounted on the package. The techniques of this disclosure may be used to determine the shunt material, the shunt size, and the shape of the shunt to accurately control the value of the resistance of the shunt. The arrangement of the die and the shunt of this disclosure may include advantages such as maintaining a small package size, allow accurate temperature compensation and reduce gain error. The shunt, according to this disclosure, may be long enough to have a measurable resistance that may be used to estimate the value of the current through the shunt. In some examples, the arrangement of the die and the shunt may provide additional structural support to the package.

In one example, the disclosure is directed to a device comprises comprising: a circuit substrate comprising a first segment, a second segment, and a die paddle, wherein the first segment is adjacent to the die paddle on a first side of the die paddle and the second segment is adjacent to the die paddle on a second side of the die paddle different from the first side. The device includes a die comprising a first surface and a second surface, wherein the first surface of the die is attached to the die paddle, and a shunt comprising a resistive element that includes an arched portion, a first attachment portion and a second attachment portion. The first attachment portion is attached to the first segment, the second attachment portion is attached to the second segment, and the arched portion is positioned over the second surface of the die.

In another example, the disclosure is directed to a method comprising: measuring, by a circuit, a voltage across a resistive element, wherein the circuit comprises a die including a first surface, a second surface, a first terminal on the second surface and a second terminal on the second surface, determining, by the circuit, a current through the resistive element based in part on the voltage across the resistive element, wherein: the resistive element comprises an arched portion, a first attachment portion and a second attachment portion, the first terminal of the die is electrically connected to the first attachment portion, the second terminal of the die is electrically connected to the second attachment portion, the first terminal and the second terminal are configured to measure the voltage across the resistive element, the first surface of the die is mounted on a leadframe die paddle, and the resistive element is positioned such that: the first attachment portion is adjacent to a first side of the leadframe die paddle and electrically isolated from the die paddle, the second attachment portion is adjacent to a second side of the leadframe die paddle different from the first side and electrically isolated from the die paddle, and the arched portion of the resistive element is positioned over the second surface of the die.

In another example, the disclosure is directed to a method of manufacturing a package, the method comprising: attaching a first surface of a die to a die paddle, attaching a first attachment portion of a shunt to a first segment, wherein the first segment is adjacent to a first side of the die paddle, attaching a second attachment portion of the shunt to a second segment, wherein the second segment is adjacent to a second side of the die paddle different from the first segment, and wherein an arched portion of the shunt is positioned over a second surface of the die. Electrically connecting a first terminal of the die to the first attachment portion of the shunt, electrically connecting a second terminal of the die to the second attachment portion of the shunt, wherein the first terminal and the second terminal are configured to determine a voltage across the shunt.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to a shunt integrated into a circuit on a substrate, such as a ceramic substrate, a laminate, a leadframe package or similar substrate. The shunt may comprise an arched conductor positioned to bridge over a die mounted on the package and may be used to measure current. The techniques of this disclosure determine the size and shape and shunt material to accurately control the value of the resistance of the shunt. The shunt may be mounted, for example, to leadframe segments on at least two sides of the die. In some examples the shunt may be electrically connected to the segments, such as by solder or conductive epoxy. In other examples the shunt may be electrically isolated from the substrate, such as by non-conductive epoxy. The shunt conductive material may be a single metal, such as copper (Cu) or aluminum (Al) or some alloy. The techniques of this disclosure describe cross-sectional area, shape, thickness and other properties to control the value of resistance and the temperature coefficient of resistivity (TCR).

In some techniques, a shunt used to measure current may include electrical connections to a die paddle on which the die is mounted. The conductive die paddle may be larger than the die to be long enough to provide enough resistance for the shunt to measure a voltage drop and determine the value of the current, e.g. the amperage. In other examples, a shunt may be next to the die, and may include a serpentine, or similar pattern, to produce a conductor long enough to have sufficient resistance. The die paddle technique mentioned above, the side shunt technique mentioned above, and similar techniques may have disadvantages because the overall package size may be larger than needed for the die. For example, a large die paddle may be needed to be long enough for sufficient resistance, and the die paddle may be larger than the die. Also, some other shunt techniques may include costly low-TCR materials, require a separate amplifier circuit or other similar techniques that increase the package size, cost or both. In some examples, shunt techniques may include non-functional area in the package, which is undesirable.

In contrast to the various approaches mentioned above, in some examples, the techniques of this disclosure can result in an arrangement of the die and the shunt that can achieve advantages such as maintaining a small package size, allowing accurate temperature compensation and reduce gain error. In some examples, the arrangement of the die and the shunt may also provide additional structural support to the package.

Figure 1A:
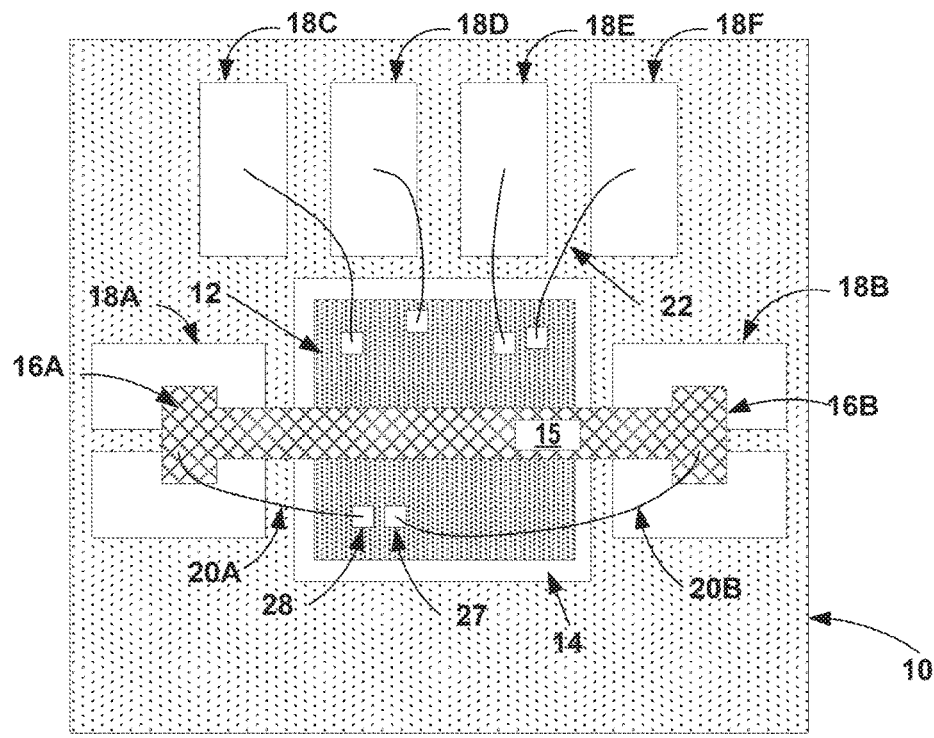
FIG. 1A is a conceptual diagram illustrating a circuit substrate device that includes a shunt for measuring current, in accordance with one or more techniques of this disclosure.

FIG. 1A is a conceptual diagram illustrating a circuit substrate device that includes a shunt for measuring current, in accordance with one or more techniques of this disclosure. A circuit substrate may include a ceramic substrate, a laminate, a leadframe package or similar substrate. For clarity and simplicity, this description will focus on the example of a leadframe package, although other packages may also benefit from the techniques described herein.

The circuit of FIG. 1A depicts a leadframe package 10 that includes segments 18A-18F, die paddle 14, a die 12, a shunt 15, and one or more electrical connections. In the example of FIG. 1A, the electrical connections include wire bonds 20A, 20B and multiple wire bonds 22. To simplify the figures, multiple wire bonds 22 do not have individual reference numbers.

Die 12 may include any die, such as an integrated circuit, transistor, or similar component. Die 12 may include at least two surfaces. A first surface may be connected to die paddle 14 and a second surface may include one or more terminals, such as terminals 28 and 27. Die 12 may be attached to die paddle 14 by a conductive or non-conductive techniques may include solder, conductive epoxy, such as silver or copper epoxy, or similar techniques. Some examples of non-conductive techniques may include non-conductive adhesives, such as non-conductive epoxy, adhesive film, such as transfer adhesive or similar techniques.

Package 10 may include one or more segments 18A-18F (collectively segments 18). In the example of a leadframe package, segments may be referred to as leadframe segments. Segments 18C-18F depict segments that may provide input or output for various terminals of die 12 and are connected to die 12 with multiple wire bonds 22. Segment 18A is adjacent to die paddle 14 on a first side of die paddle 14. Segment 18B is a second segment adjacent to die paddle 14 on a second side of the die paddle different from the first side. In the example of FIG. 1A, segment 18B is opposite segment 18A, but in other examples segment 189 may be on a side of die paddle 14 adjacent to segment 18A, similar to the location of segment 18E. In some examples, segments 18 are electrically isolated from die paddle 14.

Shunt 15 may comprise a clip type resistive element that includes attachment portions 16A and 16B. Shunt 15 may also include an arched portion positioned over the second surface of the die, which is shown in more detail in FIGS. 1A and 1B. The first attachment portion, 16A is attached to the first segment 18A. Similarly, the second attachment portion 16B is attached to the second segment 18B. Attachment portions 16A and 16B may be attached to segments 18A and 18B by either conductive or non-conductive techniques, similar to that described above for connecting die 12 to die paddle 14.

FIG. 1A also depicts attachment portions 16A and 16B connected to additional segments on package 10 that are adjacent to segments 18A and 18B. In other examples, attachment portions 16A and 16B may connect to a single segment respectively, such as 16A to 18A. In other examples, each attachment portion may connect to two or more segments on package 10, similar to the example of FIG. 1A. In other examples, attachment portions 16A and 16B may connect directly to the substrate, such as package 10.

Shunt 15 may be formed of any of a variety of conductive materials, such as aluminum, copper, an alloy that includes copper, nickel or manganese or some similar material. The amount of impedance between attachment portions 16A and 16B may be controlled by controlling the dimensions of shunt 15. For example, as with any conductor, increasing the length of shunt 15 may increase the value of the resistance between attachment portions 16A and 16B. For simplicity, the impedance of shunt 15 will be described as resistance, though, as with any conductor, shunt 15 may include other impedance, such as inductance. The resistance (R) of shunt 15 may also be controlled by selecting the material, cross-sectional area, shape and other features of shunt 15.

Some features of shunt 15 may incur non-recurring engineering (NRE) costs. NRE is a broad term referring to a one-time cost to develop, design, or manufacture a new product. In some examples, NRE refers to specific setup costs for manufacturing a newly introduced assembly or component.

Die 12 may include one or more terminals configured to measure a voltage across shunt 15. Terminal 28 electrically connects to attachment portion 16A with wire bond 20A. Terminal 27 electrically connects to attachment portion 16B with wire bond 20B. In other examples terminal 28 may electrically connect to segment 18A, which may be electrically connected to attachment portion 16A. In other examples, terminals 28 and 27 may electrically connect to attachment portions 18A and 18B by techniques other than wire bonds 20A and 20B. Wire bonds 20A and 20B may electrically connect to terminals 28 and 27, and attachment portions 18A and 18B, by electron beam weld, laser weld pressure weld, solder or similar techniques.

In operation, determining the voltage (V) across shunt 15, and knowing the value of the resistance at terminals 28 and 27 will allow die 12, or some other component included in the circuit on package 10, to determine the current passing through shunt 15 by Ohm's Law (V=IR). The value of the current (I), e.g. the amperage value, through shunt 15 may be used by other portions of the circuit. The arrangement of shunt 15 in close proximity to die 12 means that die 12 may estimate the temperature of shunt 15 by measuring the temperature of die 12. As with any resistive element, the resistance of shunt 15 may be affected by the temperature coefficient of resistivity (TCR) of shunt 15. Die 12 may be configured to compensate or adjust the determined value of the current through shunt 15 based in part on the TCR of shunt 15. In some examples, the temperature of shunt 15 may be substantially equal to the temperature of die 12. This will be discussed in more detail below.

Figure 1B:
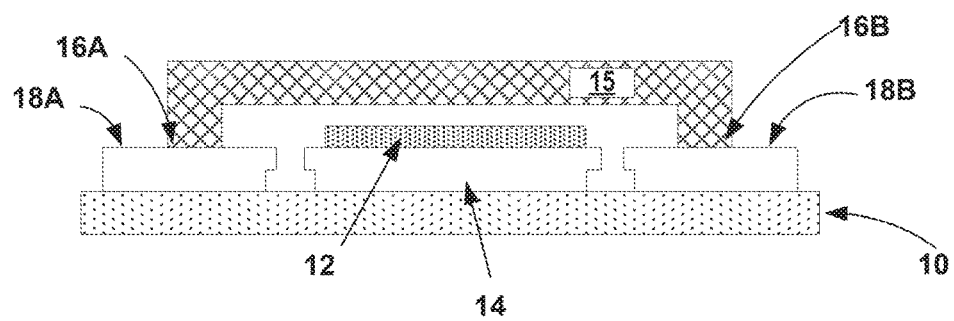
FIG. 1B is a conceptual diagram illustrating a side view of a device that includes a shunt, in accordance with one or more techniques of this disclosure.

FIG. 1B is a conceptual diagram illustrating a side view of a device that includes a shunt, in accordance with one or more techniques of this disclosure. As described in relation to FIG. 1A, FIG. 1B depicts package 10 that includes segments 18A-18F, die paddle 14, a die 12 and shunt 15.

As with FIG. 1A, shunt 15 in the example of FIG. 1B is a resistive element that includes attachment portions 16A and 16B and an arched portion positioned over the second surface of die 12. In the example of FIG. 1B, the arched portion of shunt 15 is electrically isolated and physically isolated from die 12. Die 12 may include one or more terminals configured to measure a voltage across shunt 15. The terminals may be electrically connected by wire bonds, or similar means (not shown in FIG. 1B) to attachment portions 16A and 16B.

Though the example of FIG. 1B depicts shunt 15 as connected to segments 18A and 18B on opposite sides of die paddle 14, in other examples, shunt 15 may be connected to segments on adjacent sides of die paddle 14, as described in relation to FIG. 1A. In some examples, package 10 may include two or more shunts positioned over the second surface of die 12.

Figure 1C:
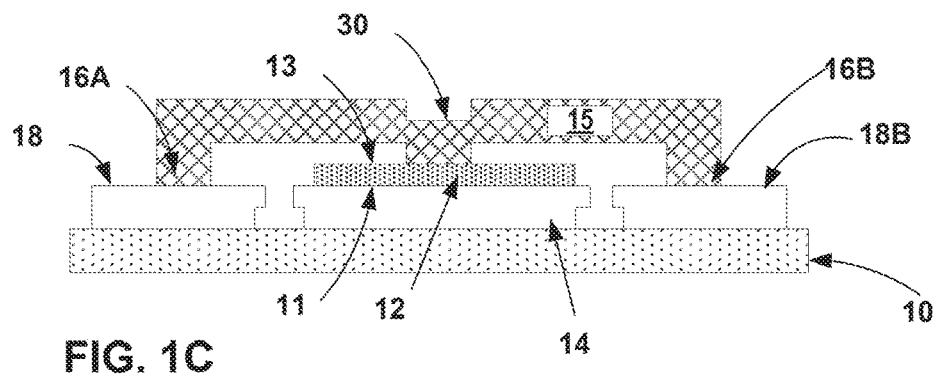
FIG. 1C is a conceptual diagram illustrating a side view of another example device that includes a shunt, in accordance with one or more techniques of this disclosure.

FIG. 1C is a conceptual diagram illustrating a side view of another example device that includes a shunt, in accordance with one or more techniques of this disclosure. As described in relation to FIG. 1A, FIG. 1B depicts package 10 that includes segments 18A-18F, die paddle 14, a die 12 and shunt 15.

FIG. 1C depicts the first surface 11 of die 12 and the second surface 13 of die 12. As described above in relation to FIG. 1A, the first surface 11 may be connected to die paddle 14 by a variety of conductive or non-conductive techniques. The second surface 13 of die 12 may include one or more terminals, such as terminals 28 and 27 described above in relation to FIG. 1A (not shown in FIG. 1C).

The example of FIG. 1C depicts shunt 15 that includes a formed portion 30. Formed portion 30 may be connected to die 12 physically, electrically and/or thermally. In the example of FIG. 1B, shunt 15 is electrically isolated from die 12, except for the connections to terminals 28 and 27. In FIG. 1C, formed portion 30 may be electrically connected to die 12. In other examples, formed portion 30 may be physically connected, but not electrically connected to die 12. In other examples, formed portion 30 may be thermally connected to die 12 and may include thermal paste at the connection.

Formed portion 30 may be shaped or formed in shunt 15 by a variety of techniques. Some examples may include etching, swaging, bending, and similar techniques. Formed portion 30 may provide additional mechanical and structural support to package 10. By thermally connecting shunt 15 to die 12, formed portion 30 may provide a more accurate measurement of the temperature of shunt 15 and therefore allow a more accurate temperature compensation when determining the current through shunt 15. In some examples, the shunt material may have similar material properties as the base substrate, such as leadframe package 10, which may improve the estimate for the TCR.

The arrangement of shunt 15 and die 12, according to the techniques of this disclosure may provide advantages over conventional techniques. For example, shunt 15 positioned over die 12 may bring shunt 15 in close proximity to die 12, when compared to a shunt resistor formed alongside die 12, such as a serpentine shunt resistor. This may allow a more accurate determination of the shunt temperature, and therefore a more accurate adjustment of the determined current through shunt 15 by using TCR. The shunt arrangement of this disclosure may also allow a smaller package size when compared to a side shunt resistor or a die paddle that may be used as a shunt resistor. As described above, a die paddle used as shunt resistor may be larger than the die to develop enough resistance to determine current.

Figure 2A:
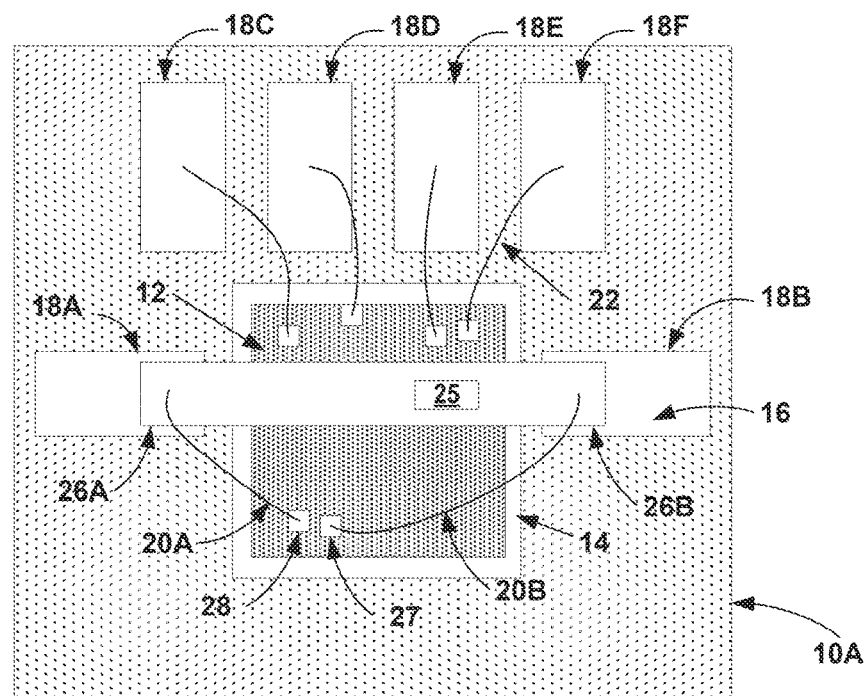
FIG. 2A is a conceptual diagram illustrating another example device that includes a shunt for measuring current, in accordance with one or more techniques of this disclosure.

FIG. 2A is a conceptual diagram illustrating another example device that includes a shunt for measuring current, in accordance with one or more techniques of this disclosure. As with FIG. 1A, the circuit substrate may comprise a variety of materials but for clarity, this description will focus on the example of a leadframe package.

Figure 2B:
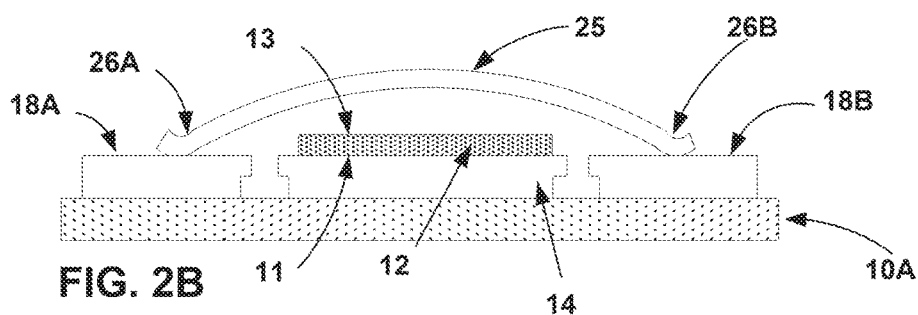
FIG. 2B is a conceptual diagram illustrating a side view of a device that includes another example of a shunt, in accordance with one or more techniques of this disclosure.
Figure 2C:
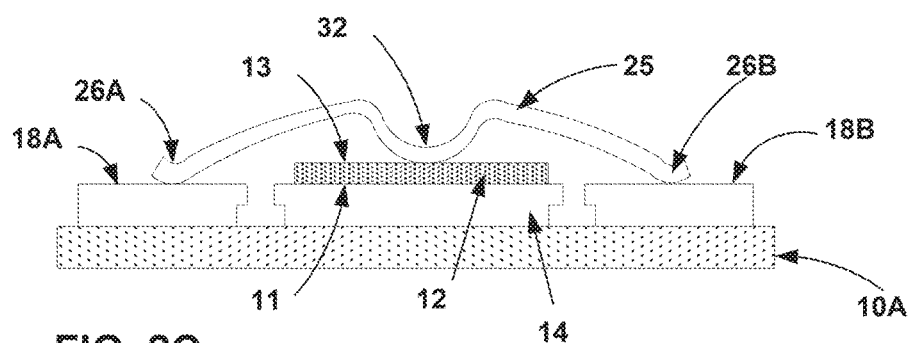
FIG. 2C is a conceptual diagram illustrating a side view of another example of a shunt with a formed portion in contact with a die, in accordance with one or more techniques of this disclosure.

Reference numbers in FIGS. 2A-2C that are the same as other figures in this disclosure indicate the elements referred to by the reference numbers are the same. For example, FIG. 2A includes leadframe package 10A with segments 18A-18F, die paddle 14, a die 12, and one or more electrical connections that may include wire bonds 20A, 20B and multiple wire bonds 22. Package 10A corresponds to package 10, depicted in FIG. 1, except package 10A includes a different arrangement of segments 18A-18F. Package 10A, and elements 12, 14, 18A-18F, 20A, 20B and 22 have the same properties and perform the same functions as described above in relation to FIGS. 1A-1C.

In the example of FIG. 2A, package 10 may include segment 18A that is adjacent to die paddle 14 on a first side of die paddle 14. Segment 18B is a second segment adjacent to die paddle 14 on a second side of the die paddle opposite from segment 18A. As with FIG. 1A, in other examples segment 18B may be on a side of die paddle 14 adjacent to segment 18A, similar to the location of segment 18E, rather than on the opposite side of die 12. In some examples, segments 18 are electrically isolated from die paddle 14.

FIG. 2A depicts shunt 25 with attachment portions 26A and 26B. Shunt 25 is a resistive element that performs the same function as shunt 15 described above in relation to FIGS. 1A-1C. Shunt 25 may be made from a conductive ribbon, such as copper ribbon, aluminum ribbon, or some other conductive material. Similar to shunt 15, shunt 25 includes an arched portion position over the second surface of die 12, which is the top, exposed surface as shown in FIG. 2A. As with the package depicted in FIGS. 1A-1C, in some examples, the package and components may be covered with an encapsulant, such as a non-conductive epoxy encapsulant. Covering the package and components with an encapsulant may help protect the components on package 10, especially any fragile components such as wire bonds 22.

Attachment portion 26A connects to segment 18A and attachment portion 26B connects to segment 18B. As described above, the attachment portions may be bonded to the segments by a variety of techniques including welding, solder, adhesives and similar techniques. FIG. 2A also depicts attachment portion 16A connected to a single segment 18A. In other examples, each attachment portion may connect to two or more segments on package 10, similar to the configuration shown in FIG. 1A. In other examples, attachment portions 26A and 26B may connect directly to the substrate.

Die 12 may include one or more terminals on the second surface 13 of die 12 that are configured to measure a voltage across shunt 25. Like FIG. 1A described above, terminal 28 electrically connects to attachment portion 26A with wire bond 20A and terminal 27 electrically connects to attachment portion 26B with wire bond 20B.

The operation of shunt 25 is the same as described above for shunt 15. Use of a ribbon instead of a clip for a shunt may have advantages in reducing manufacturing complexity, lower costs per unit, and reduced NRE. A ribbon may be formed into a shape, including forming the attachment portions, by bending in a press or by some similar technique that may be less complex than for a clip.

FIG. 2B is a conceptual diagram illustrating a side view of a device that includes another example of a shunt, in accordance with one or more techniques of this disclosure. As described in relation to FIG. 2A, FIG. 2B depicts package 10A that includes segments 18A-18F, die paddle 14, a die 12 and shunt 25.

Shunt 25 may comprise a resistive element made from a conductive ribbon, as described above. The arched portion of shunt 25 is position over the second surface 13 of die 12, and in the example of FIG. 2B, is physically isolated from die 12. The arrangement of shunt 25 may allow shunt 25 to be long enough to have sufficient resistance for terminals 27 and 28 to determine a voltage across shunt 25 and therefore, determine the current through shunt 25 by Ohm's Law. The value of the current may be measured in milliamps (mA) or microamps (μA), in some examples. In other words, positioning shunt 25 to arch over die 12, allows shunt 25 to have sufficient resistance to measure a voltage and determine current value, i.e. amps through shunt 25. The arrangement of shunt 25 and die 12 may maintain a smaller package size when compared to other techniques, as described above.

Shunt 25 includes attachment portions 26A and 26B. FIG. 2B depicts one example shape for attachment portions 26A and 26B. In other examples, attachment portions 26A and 26B may be formed in a flat shape to conform to the surface of segments 18A, or some other shape.

FIG. 2C is a conceptual diagram illustrating a side view of another example of a shunt with a formed portion in contact with a die, in accordance with one or more techniques of this disclosure. Formed portion 32 may perform the same functions as described above tier formed portion 30. For example, formed portion 32 may be in physical contact with die 12, but be electrically isolated from die 12. In other examples, formed portion 32 may be electrically and/or thermally connected to die 12. The proximity of shunt 25 to die 12 may allow more accurate temperature compensation for the value of current determined via terminals 27 and 28 by using the TCR of the shunt material. In some example, formed portion 32 may provide physical support to die 12, and other components of package 10A.

As described above, use of a ribbon as shunt may allow cost savings over the use of a clip. For example, formed portion 32, attachment portions 26A and 26B and the arched portion of shunt 25 depicted in FIG. 2C by be formed by a single stamping process. Some examples of a stamping process may feed a ribbon into the stamp, then stamp, form and cut the ribbon at the same time. This process of using a ribbon may have advantages in cost savings and NRE as described above. Selecting the width, length, cross-sectional area, material and other features of shunt 25, may result in an accurate value of resistance for shunt 25. An accurate resistance may in turn result in an accurate determination of the current through shunt 25.

Figure 3:
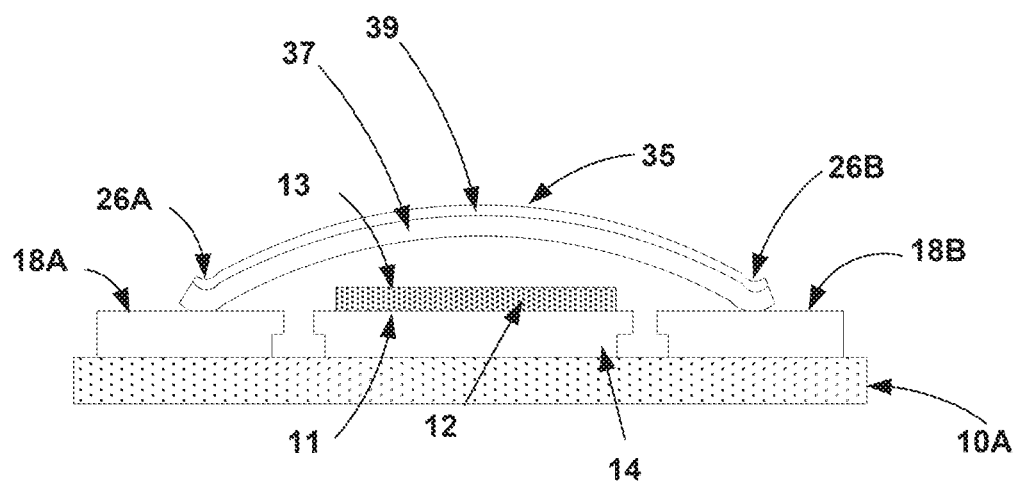
FIG. 3 is a conceptual diagram illustrating a side view of a bimetallic shunt, in accordance with one or more techniques of this disclosure.

FIG. 3 is a conceptual diagram illustrating a side view of a bimetallic shunt, in accordance with one or more techniques of this disclosure. Though not shown in FIG. 3, shunt 35 may include a formed portion in contact with a die as shown in FIGS. 1C and 2C.

Shunt 35 may be formed by bonding two or more different conductive materials together and forming the arched portion and attachment portions 26A and 26B. As one example, shunt 35 may be formed with aluminum (Al) ribbon 37 bonded to copper (Cu) ribbon 39. Al ribbon 37 may be available in a variety of sizes, including widths of 0.1-4 mm (5-150 mils). Al ribbon 37 may be less malleable and more robust than Cu ribbon 39. The Al ribbon portion of shunt 35 may provide greater structural strength and a more reliable circuit assembly, especially for applications exposed to shock or vibration.

The Cu ribbon portion of shunt 35 may allow direct wire bonding using processes that may be suited for Cu-to-Cu bonding. As with shunt 15 and shunt 25 above, the length, materials, loop profile and other dimensions of shunt 35 may be controlled to accurately determine the resistance value of shunt 35.

Figure 4:
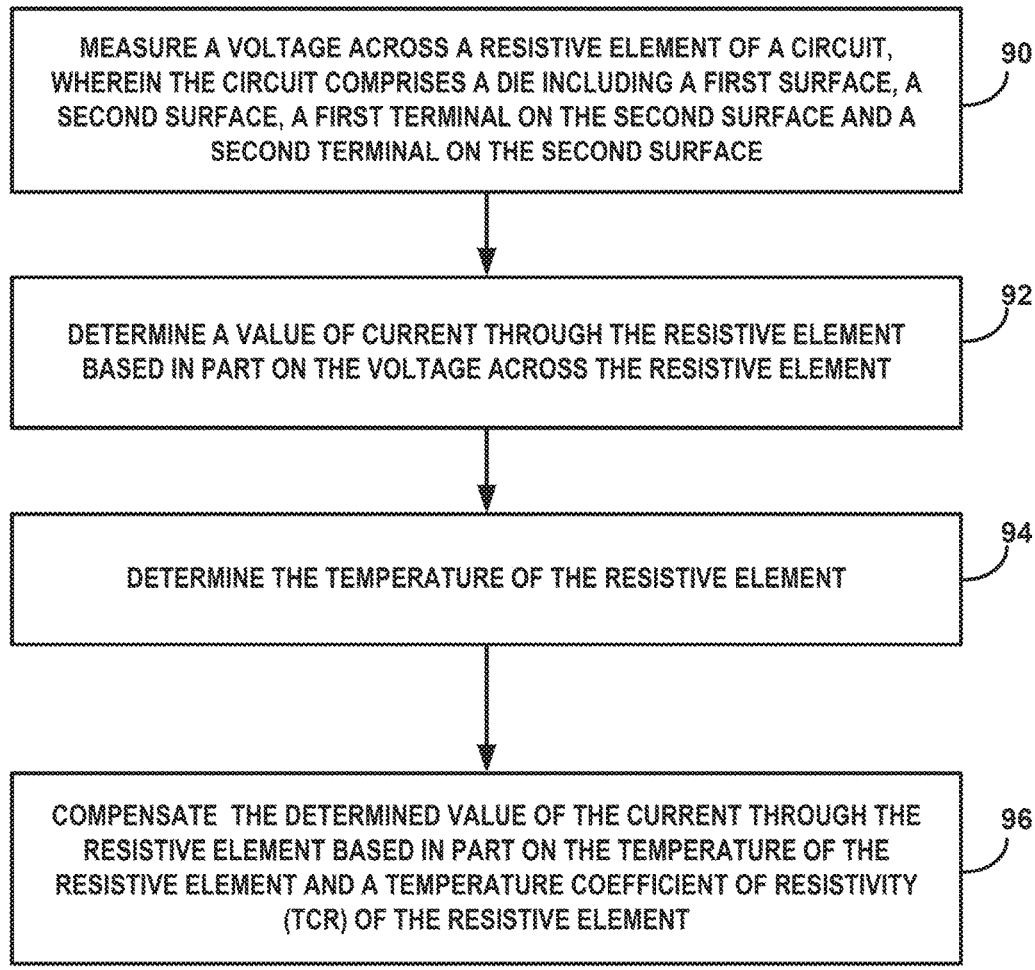
FIG. 4 is a flowchart illustrating an example operation of a circuit including a shunt positioned over a die, in accordance with one or more techniques of this disclosure.

FIG. 4 is a flowchart illustrating an example operation of a circuit including a shunt positioned over a die, in accordance with one or more techniques of this disclosure. The steps of FIG. 4 will be described in terms of FIGS. 1A-1C.

Terminals 27 and 28, via wire bonds 20A and 20B measure a voltage across shunt 15, which is a resistive element (90). Terminals 27 and 28, in the example of FIG. 1A are on the second surface 13 of die 12. The first surface 11 of die 12 may be attached to die paddle 14, or in some examples, directly to a substrate such as the leadframe of package 10.

Die 12, or some other component of the circuit determines a current through the resistive element, shunt 15, based in part on the voltage across shunt 15 (92). As described above, shunt 15 includes an arched portion, a first attachment portion 16A and a second attachment portion 16B. The arched portion of the resistive element, shunt 15, is positioned over the second surface 13 of die 12 and in some examples, physically, electrically and/or thermally connected to die 12.

Die 12, or some other portion of the circuit, may determine the temperature of shunt 15 (94). Based in part on the temperature of 15 and the TCR of shunt 15, the circuit may compensate or adjust the value of the determined current through shunt 15 (96). The TCR of shunt 15 may depend on the properties of shunt 15, such as the material and dimensions.

Figure 5:
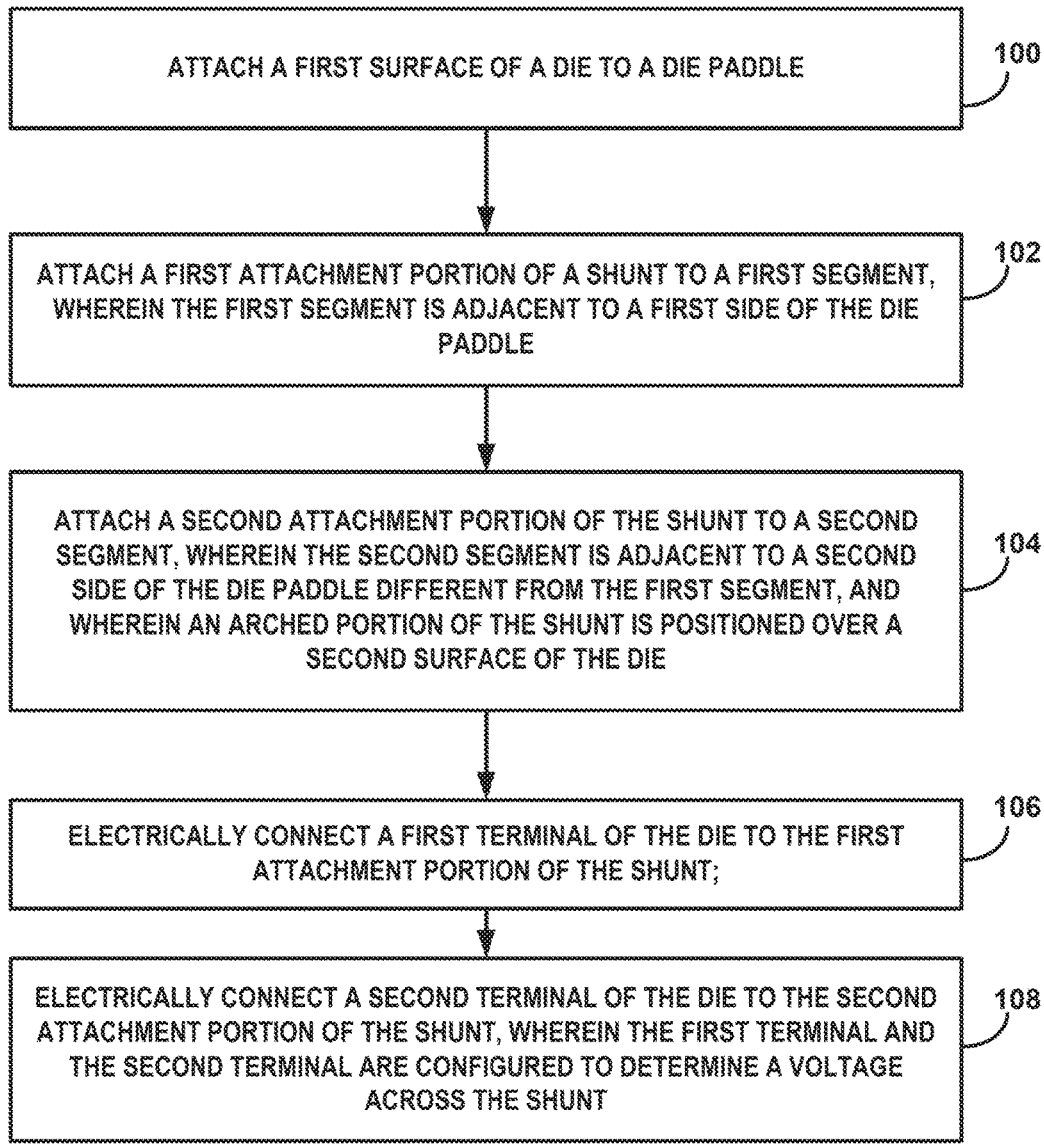
FIG. 5 is a flow chart illustrating an example manufacturing operation to make a package including a shunt positioned over a die, in accordance with one or more techniques of this disclosure.

FIG. 5 is a flow chart illustrating an example manufacturing operation to make a package including a shunt positioned over a die, in accordance with one or more techniques of this disclosure. The steps of FIG. 5 will be described in terms of FIGS. 1A-1C.

In the manufacturing process, a first surface 11 of a die 12 is attached to a die paddle 14 (100). As described above attaching die 12 to die paddle 14 may be done by a variety of conductive or non-conductive means.

A first attachment portion 16A of shunt 15 may be attached to a first segment 18A that is adjacent to a first side of die paddle 14 (102). As with attaching die 12 to die paddle 14, attaching first attachment portion 16A to segment 18A may be done by conductive means, such as solder or by non-conductive means such as non-conductive adhesive.

Similarly, a second attachment portion 16B of shunt 15 may be attached to a second segment 18B that is adjacent to a second side of die paddle 14 different from the side of the die paddle where the first segment 18A is located (104). The arched portion of shunt 15 may be positioned over the second surface 13 of die 12. In some examples, more than one shunt may be positioned over die 12.

A first terminal, e.g. terminal 28 of die 12 may be electrically connected to the first attachment portion 16A of shunt 15 (106). In the example of FIG. 1A, the electrical connection, is wire bond 20A.

A second terminal, e.g. terminal 27 of die 12 may be electrically connected to the second attachment portion 16B of shunt 15 (108). As described above, terminals 27 and 28 are configured to determine a voltage across shunt 15.

Example 1

A device comprises comprising: a circuit substrate comprising a first segment, a second segment, and a die paddle, wherein the first segment is adjacent to the die paddle on a first side of the die paddle and the second segment is adjacent to the die paddle on a second side of the die paddle different from the first side. The device includes a die comprising a first surface and a second surface, wherein the first surface of the die is attached to the die paddle, and a shunt comprising a resistive element that includes an arched portion, a first attachment portion and a second attachment portion. The first attachment portion is attached to the first segment, the second attachment portion is attached to the second segment, and the arched portion is positioned over the second surface of the die.

Example 2

The device of example 1, further comprising a first terminal of the die and a second terminal of the die, wherein: the first terminal of the die is electrically connected to the first attachment portion of the shunt, the second terminal of the die is electrically connected to the second attachment portion of the shunt, and the first terminal and the second terminal are configured to measure a voltage across the shunt.

Example 3

The device of any of examples 1-2 or any combination thereof, wherein the die is configured to determine a current through the shunt based on the voltage across the shunt.

Example 4

The device of any combination of examples 1-3, wherein the die is configured to compensate the determined current based in part on a temperature coefficient of resistivity (TCR) of the resistive element.

Example 5

The device of any combination of examples 1-4, wherein the arched portion of the shunt is thermally connected to the die.

Example 6

The device of any combination of examples 1-5, wherein the temperature of the shunt is substantially equal to the temperature of the die.

Example 7

The device of any combination of examples 1-6, wherein the arched portion of the shunt is physically coupled the die.

Example 8

The device of any combination of examples 1-7, wherein the arched portion of the shunt is electrically connected to the die.

Example 9

The device of any combination of examples 1-8, wherein the first attachment portion is electrically connected to the first segment and the second attachment portion is electrically connected to the second segment.

Example 10

The device of any combination of examples 1-9, wherein the shunt is electrically isolated from the first segment and the second segment.

Example 11

The device of any combination of examples 1-10, wherein the resistive element comprises an aluminum ribbon, a copper ribbon, a bimetallic ribbon, a conductive clip an aluminum clip, a copper clip, or an alloy clip.

Example 12

A method comprising: measuring, by a circuit, a voltage across a resistive element, wherein the circuit comprises a die including a first surface, a second surface, a first terminal on the second surface and a second terminal on the second surface, determining, by the circuit, a current through the resistive element based in part on the voltage across the resistive element, wherein: the resistive element comprises an arched portion, a first attachment portion and a second attachment portion, the first terminal of the die is electrically connected to the first attachment portion, the second terminal of the die is electrically connected to the second attachment portion, the first terminal and the second terminal are configured to measure the voltage across the resistive element, the first surface of the die is mounted on a leadframe die paddle, and the resistive element is positioned such that: the first attachment portion is adjacent to a first side of the leadframe die paddle and electrically isolated from the die paddle, the second attachment portion is adjacent to a second side of the leadframe die paddle different from the first side and electrically isolated from the die paddle, and the arched portion of the resistive element is positioned over the second surface of the die.

Example 13

The method of example 12, wherein further comprising: determining the temperature of the resistive element, and compensating the determined value of the current through the resistive element based in part on the temperature of the resistive element and a temperature coefficient of resistivity (TCR) of the resistive element.

Example 14

The method of any combination of examples 12-13, wherein the shunt is thermally coupled to the die.

Example 15

The method of any combination of examples 12-14, wherein the arched portion of the resistive element is electrically isolated from the die.

Example 16

The method of any combination of examples 12-15, wherein the resistive element comprises an aluminum ribbon, a copper ribbon, a bimetallic ribbon, or a conductive clip, an aluminum clip, a copper clip, or an alloy clip.

Example 17

The method of any combination of examples 12-16, wherein the first attachment portion is connected to a first segment and the second attachment portion is connected to a second segment.

Example 18

The method of any combination of examples 12-17, wherein first attachment portion is electrically isolated from the first segment and the second attachment portion is electrically isolated from the second segment.

Example 19

A method of manufacturing a package, the method comprising: attaching a first surface of a die to a die paddle, attaching a first attachment portion of a shunt to a first segment, wherein the first segment is adjacent to a first side of the die paddle, attaching a second attachment portion of the shunt to a second segment, wherein the second segment is adjacent to a second side of the die paddle different from the first segment, and wherein an arched portion of the shunt is positioned over a second surface of the die. Electrically connecting a first terminal of the die to the first attachment portion of the shunt, electrically connecting a second terminal of the die to the second attachment portion of the shunt, wherein the first terminal and the second terminal are configured to determine a voltage across the shunt.

Example 20

The method of example 19, wherein the die is configured to determine a current through the shunt based at least in part on the voltage across the shunt.

Various examples of the disclosure have been described. These and other examples are within the scope of the following claims.

The invention claimed is:

1. A device comprising:
a circuit substrate comprising a first segment, a second segment, and a die paddle, wherein the first segment is adjacent to the die paddle on a first side of the die paddle and the second segment is adjacent to the die paddle on a second side of the die paddle different from the first side;
a die comprising a first surface and a second surface, wherein the first surface of the die is attached to the die paddle; and
a shunt comprising a resistive element that includes an arched portion, a first attachment portion and a second attachment portion, wherein:
the resistive element extends along the arched portion from the first attachment portion to the second attachment portion;
the first attachment portion is attached to the first segment,
the second attachment portion is attached to the second segment, and
the arched portion is positioned over the second surface of the die.

2. The device of claim 1, further comprising a first terminal of the die and a second terminal of the die, wherein:
the first terminal of the die is electrically connected to the first attachment portion of the shunt,
the second terminal of the die is electrically connected to the second attachment portion of the shunt, and
the first terminal and the second terminal are configured to measure a voltage across the shunt.

3. The device of claim 2, wherein the die is configured to determine a value of current through the shunt based on the voltage across the shunt.

4. The device of claim 3, wherein the die is configured to compensate the determined value current based in part on a temperature coefficient of resistivity (TCR) of the resistive element.

5. The device of claim 1, wherein the arched portion of the shunt is thermally connected to the die.

6. The device of claim 1, wherein the temperature of the shunt is substantially equal to the temperature of the die.

7. The device of claim 1, wherein the arched portion of the shunt is physically coupled the die.

8. The device of claim 1, wherein the arched portion of the shunt is electrically connected to the die.

9. The device of claim 1, wherein the first attachment portion is electrically connected to the first segment and the second attachment portion is electrically connected to the second segment.

10. The device of claim 1, wherein the shunt is electrically isolated from the first segment and the second segment.

11. The device of claim 1, wherein the resistive element comprises an aluminum ribbon, a copper ribbon, a bimetallic ribbon, a conductive clip an aluminum clip, a copper clip, or an alloy clip.

12. A method comprising:
measuring, by a circuit, a voltage across a resistive element, wherein the circuit comprises a die including a first surface, a second surface, a first terminal on the second surface and a second terminal on the second surface; and
determining, by the circuit, a value of current through the resistive element based in part on the voltage across the resistive element, wherein:
the resistive element comprises an arched portion, a first attachment portion and a second attachment portion, wherein the resistive element extends along the arched portion from the first attachment portion to the second attachment portion;

the first terminal of the die is electrically connected to the first attachment portion, the second terminal of the die is electrically connected to the second attachment portion, the first terminal and the second terminal are configured to measure the voltage across the resistive element, the first surface of the die is mounted on a leadframe die paddle, and the resistive element is positioned such that:

the first attachment portion is adjacent to a first side of the leadframe die paddle and electrically isolated from the die paddle, the second attachment portion is adjacent to a second side of the leadframe die paddle different from the first side and electrically isolated from the die paddle, and the arched portion of the resistive element is positioned over the second surface of the die.

13. The method of claim 12, further comprising:
determining the temperature of the resistive element; and
compensating the determined value of the current through the resistive element based in part on the temperature of the resistive element and a temperature coefficient of resistivity (TCR) of the resistive element.

14. The method of claim 12, wherein the shunt is thermally coupled to the die.

15. The method of claim 12, wherein the arched portion of the resistive element is electrically isolated from the die.

16. The method of claim 12, wherein the resistive element comprises an aluminum ribbon, a copper ribbon, a bimetallic ribbon, or a conductive clip, an aluminum clip, a copper clip, or an alloy clip.

17. The method of claim 12, wherein the first attachment portion is connected to a first segment and the second attachment portion is connected to a second segment.

18. The method of claim 12, wherein first attachment portion is electrically isolated from the first segment and the second attachment portion is electrically isolated from the second segment.

19. A method of manufacturing a package comprising:
attaching a first surface of a die to a die paddle;
attaching a first attachment portion of a shunt to a first segment, wherein the first segment is adjacent to a first side of the die paddle;
attaching a second attachment portion of the shunt to a second segment, wherein the second segment is adjacent to a second side of the die paddle different from the first segment, and wherein an arched portion of the shunt is positioned over a second surface of the die and wherein a resistive element of the shunt extends along the arched portion from the first attachment portion to the second attachment portion;
electrically connecting a first terminal of the die to the first attachment portion of the shunt; and
electrically connecting a second terminal of the die to the second attachment portion of the shunt, wherein the first terminal and the second terminal are configured to determine a voltage across the resistive element of the shunt.

20. The method of claim 19, wherein the die is configured to determine a current through the shunt based at least in part on the voltage across the resistive element of the shunt.

* * * * *